(12) United States Patent
Wang et al.

(10) Patent No.: US 9,390,217 B2
(45) Date of Patent: Jul. 12, 2016

(54) METHODOLOGY OF OPTICAL PROXIMITY CORRECTION OPTIMIZATION

(71) Applicant: Taiwan Semiconductor Manufacturing Company, Ltd., Hsin-Chu (TW)

(72) Inventors: Hung-Chun Wang, Taichung (TW);
Ming-Hui Chih, Taipei County (TW);
Yu-Po Tang, Taipei (TW); Chia-Ping Chiang, Taipei (TW); Feng-Ju Chang, Hsinchu (TW); Cheng Kun Tsai, Hsinchu (TW); Wen-Chun Huang, Tainan (TW); Ru-Gun Liu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 206 days.

(21) Appl. No.: 14/143,677

(22) Filed: Dec. 30, 2013

(65) Prior Publication Data

US 2014/0109026 A1    Apr. 17, 2014

Related U.S. Application Data

(62) Division of application No. 13/448,977, filed on Apr. 17, 2012, now Pat. No. 8,631,360.

(51) Int. Cl.
*G06F 17/50* (2006.01)
*G03F 1/36* (2012.01)
*G03F 1/70* (2012.01)

(52) U.S. Cl.
CPC .............. *G06F 17/5081* (2013.01); *G03F 1/36* (2013.01); *G03F 1/70* (2013.01)

(58) Field of Classification Search
CPC ....... G03F 7/705; G03F 1/36; G03F 7/70441;
G03F 7/70125; G03F 1/144; G03F 7/70666;
G03F 1/70; G03F 7/70425; G03F 7/70091;
G03F 7/70433; G03F 1/84; G03F 7/70083;
G03F 7/70608; G03F 7/70625; G03F 7/70616;
G03F 7/7065; G06F 17/5081; G06F 17/5068;
G06F 17/5009; G06F 2217/12; G06F 17/10;
G06F 17/50; G06F 2217/06; G06F 2217/08
USPC ....................................................... 716/50–56
See application file for complete search history.

(56) References Cited

U.S. PATENT DOCUMENTS

| | | | |
|---|---|---|---|
| 2006/0078805 A1* | 4/2006 | Hansen | G03F 7/70091 430/5 |
| 2011/0029938 A1* | 2/2011 | Nojima | G03F 1/36 716/53 |
| 2011/0099526 A1* | 4/2011 | Liu | G03F 1/144 716/54 |

*Primary Examiner* — Binh Tat
(74) *Attorney, Agent, or Firm* — Haynes and Boone, LLP

(57) ABSTRACT

A method for performing optical proximity correction (OPC) and evaluating OPC solutions is disclosed. An exemplary method includes receiving a design database corresponding to an IC circuit mask. A first OPC modification to a mask feature of the design database is made by performing a first OPC process. The OPC process includes: dividing the mask feature into child shapes and adjusting an attribute of a child shape based on an edge placement error (EPE) factor. A first lithography simulation is performed utilizing a first set of performance indexes after making the first OPC modification, and a second OPC modification to the mask feature is made based on a result of the first lithography simulation. A second lithography simulation of the mask feature is performed utilizing a second set of performance indexes to verify the first and second OPC modifications, and the design database is provided for manufacturing.

20 Claims, 6 Drawing Sheets

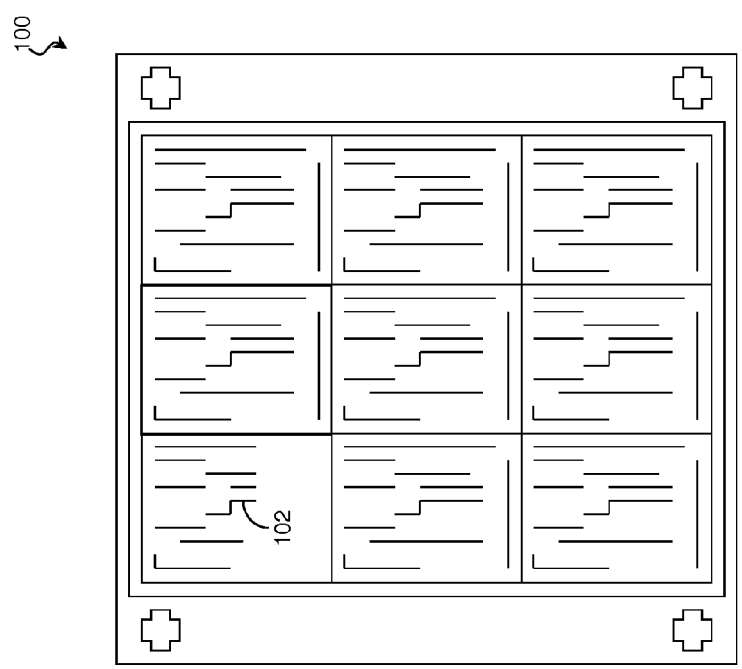

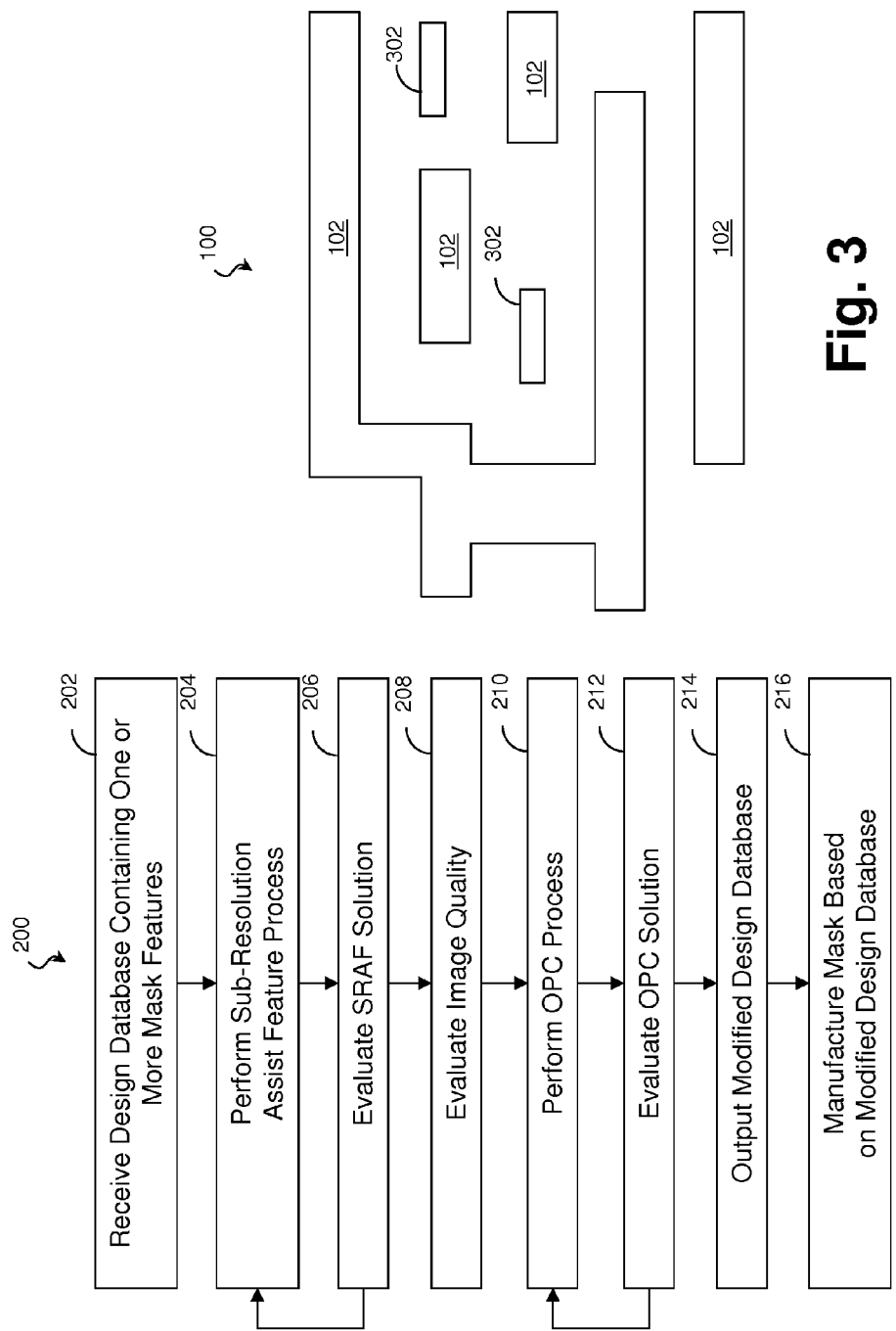

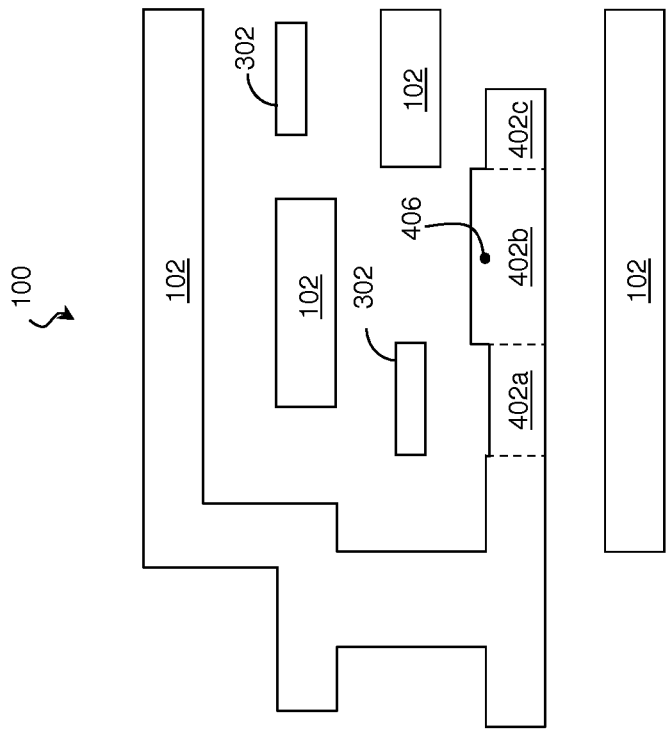
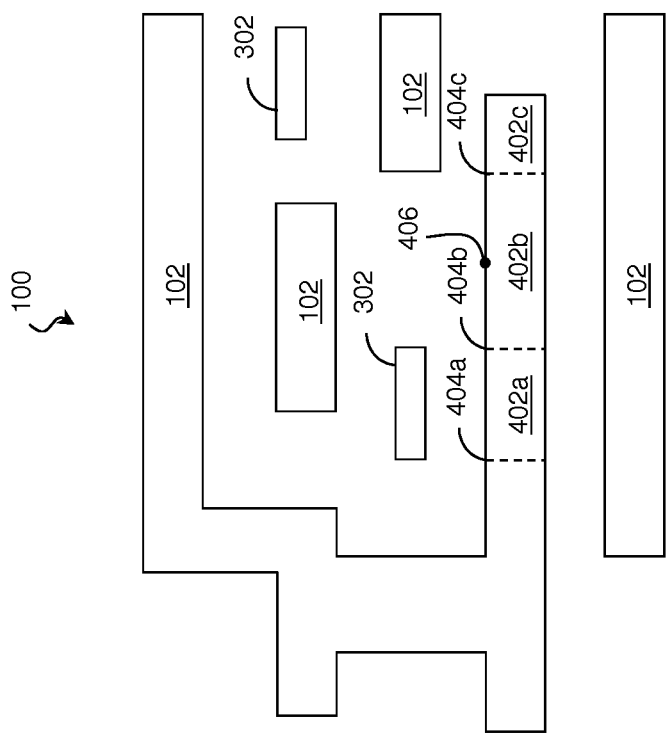

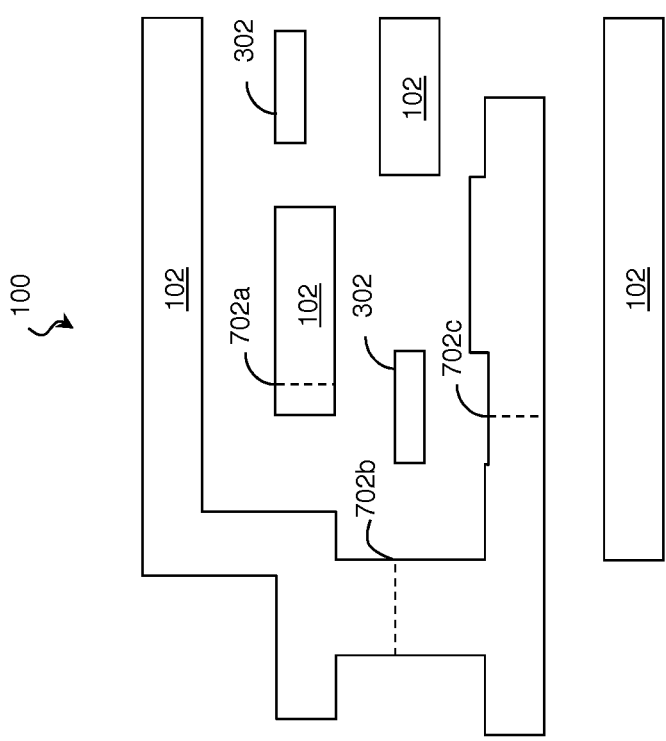

METHODOLOGY OF OPTICAL PROXIMITY CORRECTION OPTIMIZATION

PRIORITY

This application claims priority to, and is a divisional of, U.S. patent application Ser. No. 13/448,977 filed on Apr. 17, 2012, entitled "A NOVEL METHODOLOGY OF OPTICAL PROXIMITY CORRECTION AND OPTIMIZATION," now U.S. Pat. No. 8,631,360, issued on Jan. 14, 2014, the entire disclosure of which is incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

For example, behaviors of light such as diffraction, fringing, and interference become more pronounced as device size shrinks. ICs are typically assembled by layering features on a semiconductor substrate using a set of photolithographic masks. The masks have patterns formed by transmissive or reflective regions. During a photolithographic exposure, radiation such as ultraviolet light passes through or reflects off the mask before striking a photoresist coating on the substrate. The mask transfers the pattern onto the photoresist, which is then selectively removed to reveal the pattern. The substrate then undergoes processing steps that take advantage of the shape of the remaining photoresist to create circuit features on the substrate. When the processing steps are complete, photoresist is reapplied and substrate is exposed using the next mask. In this way, the features are layered to produce the final circuit.

As the minimum feature size shrinks, the nature of light causes the patterns formed on the substrate to vary from the pattern of the mask. Examples of these variances include corner rounding and edge placement errors. To correct the pattern formed on the substrate, assist features and other modifications are made to the mask in a process often referred to as optical proximity correction (OPC). Current OPC methods have delivered positive results but have not been entirely satisfactory in all regards. Thus, advances in OPC are desirable because they improve IC density, performance, and yield by allowing formation of smaller, sharper, and more uniform features.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is an illustration of an exemplary design database according to various aspects of the present disclosure.

FIG. 2 is a flow diagram of a method of optical proximity correction according to various aspects of the present disclosure.

FIGS. 3-5 are illustrations of features within an exemplary design database in various stages of a method of optical proximity correction performed according to various aspects of the present disclosure.

FIG. 7 is an illustration of features within an exemplary design database in various stages of a method of optical proximity correction and optimization performed according to various aspects of the present disclosure.

DETAILED DESCRIPTION

Figure 6:
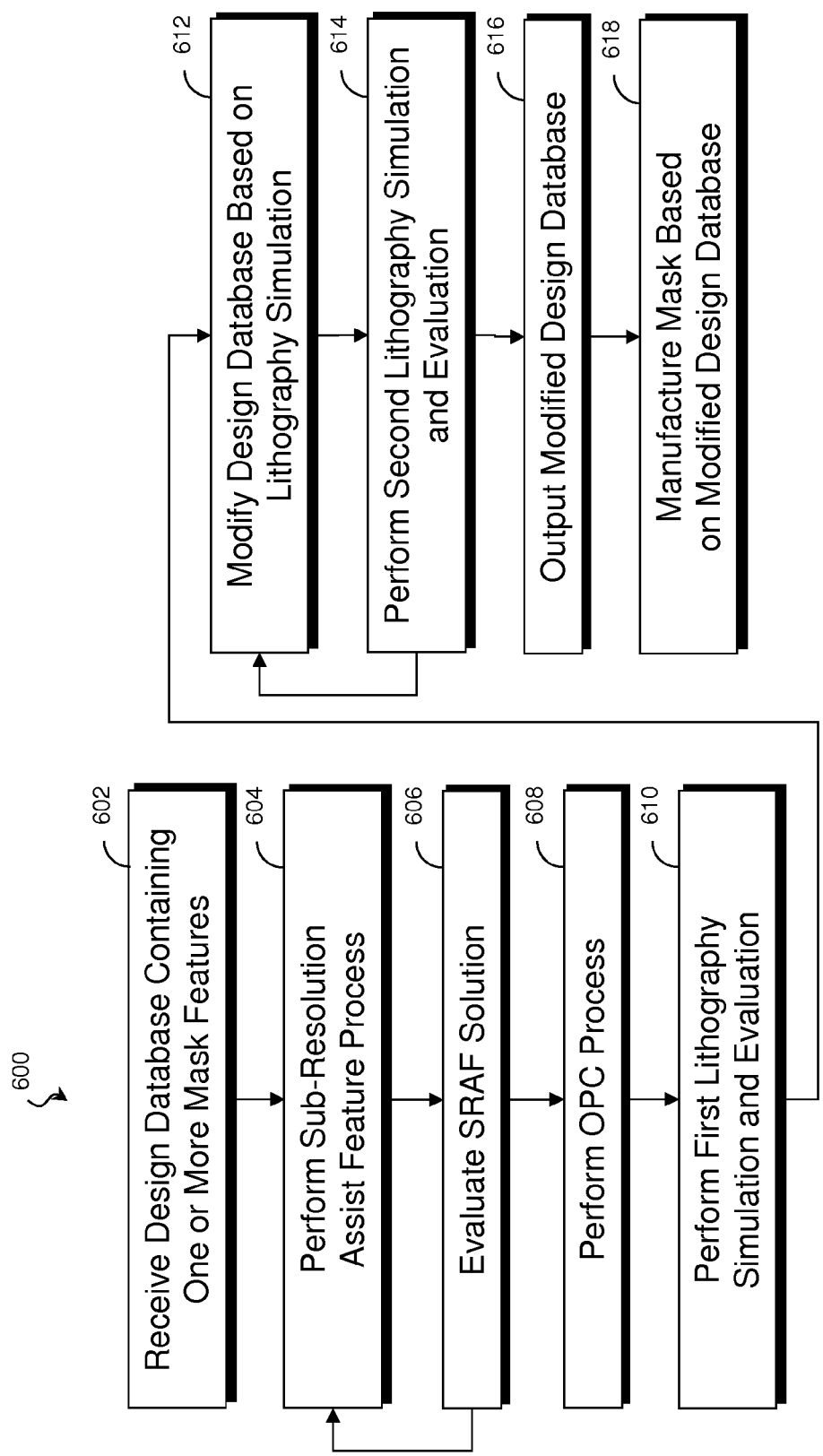
FIG. 6 is a flow diagram of a method of optical proximity correction and optimization according to various aspects of the present disclosure.

The present disclosure relates generally to optical proximity correction (OPC) and, more particularly, to a method for performing OPC and evaluating OPC solutions.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is an illustration of an exemplary design database 100 according to various aspects of the present disclosure. The design database 100 is a computer model and contains representations of mask features 102 in a predetermined design standard such as GDSII, or OASIS. These features 102 may designate active regions, gate electrodes, source and drain regions, metal shapes, interlayer vias, and any other suitable IC feature.

To create corresponding features on the semiconductor substrate and on various material layers disposed on the semiconductor substrate, a photolithographic mask is manufactured. The mask includes a mask substrate, which may be made from soda-lime glass, fused silica, calcium fluoride ($CaF_2$), and/or other suitable material. Masks typically include one or more layers such as an absorption layer of chromium (CR), MoSi, and/or other suitable materials, an attenuating layer formed from such materials as metal silicide, metal nitride, iron oxide, inorganic material and/or other suitable materials, and/or a reflective layer created using materials such as silicon/molybdenum, molybdenum/beryllium, and/or other suitable materials. Typically, the mask is formed using a mask writing technique such as electron beam writing, ion beam writing, photolithography such as binary photolithograph or phase shift photolithography coupled with etching such as wet or dry etching. The mask can also be shaped using an alternative mask writing technique.

During photolithography, radiation such as ultraviolet light passes through or reflects off the mask and strikes a photoresist coating on the semiconductor substrate. The photoresist is selectively removed to reveal a pattern that is used to create the circuit features on the substrate. While the pattern is transferred from mask to substrate, the pattern formed on the substrate is not identical to that of the mask. Physical properties of the radiation used to expose the substrate along with characteristics of processing steps may cause the features formed on the substrate to vary dramatically from the features of the mask used to expose the wafer. Thus, it may not be possible to produce accurate features using a mask created directly from the design database 100. To account for this, optical proximity correction (OPC) and sub-resolution assist feature (SRAF) processes may be performed on the design database 100. These processes alter the mask features 102 to produce substrate features that more closely match the ideal.

With reference to FIGS. 2-5, a method 200 of optical proximity correction is described. FIG. 2 is a flow diagram of the method 200 of optical proximity correction according to various aspects of the present disclosure. FIGS. 3-5 are illustrations of mask features 102 within an exemplary design database 100 in various stages of the method 200 according to various aspects of the present disclosure. It is understood that additional steps can be provided before, during, and after the method 200, and some of the steps described can be replaced or eliminated for other embodiments of the method.

Referring to FIGS. 2 and 3, in block 202, a design database 100 containing one or more mask features 102 is received. In block 204, a sub-resolution assist feature (SRAF) process is performed on the design database 100. The SRAF process may include adding, removing, and/or modifying SRAFs 302 in the design database 100. Mask features in proximity to one another produce better quality substrate features than isolated mask features produce. One cause is diffraction interference. Light passing through parallel openings in a mask produces bands of high and low intensity caused by interference. Likewise, closely spaced mask features constructively interfere to produce a more focused dose of radiation on the substrate. This creates a better feature on the substrate. To achieve similar results with isolated mask features, sub-resolution assist features 302 are added to the mask. SRAFs 302 are smaller than the minimum printable dimension and do not directly create substrate features during photolithography. However, they improve the quality of nearby printing features by leveraging properties including but not limited to diffraction interference. It is contemplated that SRAF features 302 may be used to correct any observed or suspected error as well as to generally improve any circuit characteristic such as minimum feature size, minimum pitch, minimum spacing, and yield.

In an embodiment, the SRAF process of block 204 is performed using a model-based process. In the model-based process, a pattern-matching algorithm examines shapes of the mask features 102 within the design database 100 and compares them to shapes in an SRAF database. When a shape is recognized in the SRAF database, the design database 100 is modified according to the solution contained in the SRAF database. In another embodiment, the SRAF process is a rule-based process. A rules engine analyzes the design database 100 to determine whether the contents of the database comply with a set of design rules. Violations are remedied by modifying the design database 100. These modification may include adding, removing, or modifying SRAFs 302, along with any other suitable modification. In a further embodiment, the SRAF process includes both a model-based and a rule-based process.

In block 206, the SRAF solution undergoes one or more checks to determine whether it meets a set of design criteria. If the results of the checks indicate that the SRAF solution does not meet the design criteria, the SRAF process of block 204 may be repeated. This may include modifying one or more parameters of the SRAF process to remedy violations of the design criteria. When an SRAF solution is obtained that meets the design criteria, further image quality evaluation is performed in block 208. The results of the image quality evaluation are used to drive the OPC process.

Referring to FIG. 4 and block 210, the OPC process may make modifications to mask features 102 within the design database 100 to account for and correct a number of effects. For example, angular corners on a mask feature tend to produce rounded corners on an exposed substrate. This can be caused by optical properties inherent in lithography and can also be caused by wafer processing steps including photoresist stripping, etching, and deposition. A related effect is line-end pullback, where an elongated figure prints shorter than intended. The above are merely examples of photolithographic effects that may compensated for using optical proximity correction. It is contemplated that OPC both with and without sub-resolution assist features may be performed to correct any observed or suspected error as well as to generally improve any circuit characteristic such as minimum feature size, minimum pitch, minimum spacing, and yield. To correct these and other effects, common OPC modifications include adjustments to feature sizes and added extensions often termed hammerheads or serifs. In various embodiments, OPC is carried out by model-based processes, rule-based processes, and/or a combination of model-based and rule-based processes. Depending on the design database format, OPC features may be separate shapes in the design database 100 or may be integrated into other shapes.

Referring still to block 210 and FIG. 4, in an exemplary embodiment, a mask feature is divided into multiple child shapes 402a, 402b, 402c based on dissection points 404a, 404b, and 404c. To evaluate printability, an edge of child shape 402b is simulated and measured relative to target point 406. The simulation determines an edge placement error (EPE) factor, a measure of whether a mask with child shape 402b will produce a substrate with a feature edge at the target point 406. As illustrated in FIG. 5, if child shape 402b does not produce the correct substrate feature, an attribute of child shape 402b is adjusted until the intended feature edge is achieved and the EPE requirement is met.

In block 212, the OPC solution undergoes one or more checks to determine whether it meets a set of design criteria. This may include checks against an EPE requirement and against a performance specification. The evaluation may also include one or more checks such as design rule check (DRC), mask rule check (MRC), electrical rule check (ERC), and any other suitable check. In an embodiment, the OPC solution is evaluated during the OPC process and fed back to the OPC process as it runs. In a further embodiment, the OPC solution is evaluated after the OPC process is completed. In an example of such an embodiment, the results of the evaluation are used to affect a subsequent iteration of the OPC process. In yet a further embodiment, the OPC solution is evaluated during the OPC process, and evaluated after the OPC process is completed.

If the OPC solution does not meet the design criteria, the OPC process may be repeated in block 210. This may include modifying one or more parameters of the OPC process to remedy violations of the design criteria. When an OPC solution is obtained that meets the design criteria, the design database 100 is output in block 214. In block 216, a mask is manufactured utilizing the modified design database 100. In an embodiment, the modified design database 100 is provided to a mask manufacturer for use in manufacturing a mask.

With reference to FIGS. 6 and 7, a method 600 of optical proximity correction and optimization is described. FIG. 6 is a flow diagram of the method 600 of optical proximity correction and optimization according to various aspects of the present disclosure. FIG. 7 is an illustration of features 102 within an exemplary design database 100 in various stages of the method 600 according to various aspects of the present disclosure. It is understood that additional steps can be provided before, during, and after the method 600, and some of the steps described can be replaced or eliminated for other embodiments of the method.

Referring to FIG. 6, in block 602, a design database 100 containing one or more mask features 102 is received. In block 604, a sub-resolution assist feature (SRAF) process is performed on the design database 100. In block 606, the SRAF solution is evaluated to determine whether it meets a set of design criteria. If the SRAF solution does not meet the design criteria, the SRAF process may be repeated in block 604. When an SRAF solution is obtained that meets the design criteria, an OPC process is performed in block 608. In some embodiments, the OPC process will be verified and iterated until an optimal OPC solution is obtained.

In block 610, the design database 100 undergoes a first lithography simulation and evaluation (lithography S&E) against one or more lithographic performance indexes. In an embodiment, the performance indexes include an edge placement error (EPE) check. In an EPE check, a mask feature 102 is analyzed to determine whether it will produce a substrate with a feature edge at a target point. In a further embodiment, the image log slope (ILS) and/or normalized image log slope (NILS) is calculated for a feature 102 as part of a performance index. ILS and NILS are measures of how abruptly light changes intensity. For this reason, ILS and NILS are often used in contrast checks. Sharply defined transitions from dark to light provide a precise exposure and well-defined features. A poorly defined transition may prevent a mask feature from printing entirely. Contrast checks including ILS- and NILS-based checks may be used to determine whether a mask feature will create a corresponding feature on a substrate and may also be used to determine whether the substrate feature will be the correct size and/or shape. Referring to FIG. 7, in an embodiment, a NILS calculation is made based on attributes of mask features at locations 702a, 702b, and 702c. The NILS calculation determines the characteristics of the corresponding substrate features. If a substrate feature characteristic such as width falls below a minimum threshold, the mask feature 102 is reported as failing the check.

In an embodiment, the performance indexes include focus metrics such as depth of focus (DoF). Surface variations in the substrate cause minute differences in distance between the mask and the exposure point. Despite the small size, these differences can have substantial impact on the quality of the exposure. Depth of focus is a measure of the mask's sensitivity to distance. A mask with a larger DoF produces sharper features despite surface variations. In an embodiment, an area of a design database 100 is analyzed to determine if it has a sufficient DoF. A related performance index utilized in some embodiments is the change in DoF relative to a change in exposure dose.

In an embodiment, a performance index incorporates a mask error enhancement factor (MEEF). The mask error enhancement factor is a measure of how variations in size of a mask feature 102 affect the corresponding substrate feature. Mask features are commonly larger than their corresponding substrate features. For example, a mask may be a 4× magnification of the substrate it is intended to print. The lithography process reduces the mask pattern when exposing the substrate. Ignoring the MEEF, a change in mask feature size would cause a corresponding change in the substrate feature of ¼ of the size. However, the optical relationships during exposure are not always linear. A mask feature variance can cause a substrate variance smaller or larger than ¼ of the mask variance. The MEEF accounts for this effect. In an embodiment, a mask error enhancement factor (MEEF) is used in determining the overlap of a substrate feature with a structure on an adjacent layer such as a gate stack, an active region, and/or an inter-layer via. If the substrate feature is determined to overlap improperly, the corresponding mask feature 102 is reported as failing the check.

In an embodiment, a performance index incorporates a process window (PW) factor. A PW factor is a determination of how changes in process factors such as dosage, intensity, environment, and duration affect resulting substrate features. In an embodiment, the performance indexes include a PW calculation of the change in critical dimension (minimum feature size) over a change in exposure dosage.

These examples of performance indexes are not limiting. It is contemplated that the lithography simulation and evaluation will involve any number of performance indexes used to evaluate any number of feature characteristics.

In block 612, the design database 100 is modified in response to the first lithography S&E. The modifications may include optimizing SRAFs 302 within the design database 100 by such exemplary optimizations as moving, resizing, inserting, and deleting SRAFs. Modifications to the database may also include optimizing mask features 102. In an embodiment, features 102 are optimized directly by modifying the design database 100 based on the results of the first lithography S&E. Features 102 may also be optimized indirectly. For example, a parameter of an OPC process may be modified based on the results of the first lithography S&E. Then the OPC process may be performed on the design database 100 utilizing the modified parameter. In an exemplary embodiment, an OPC database is updated to modify the shapes detected by the OPC engine and/or to alter the solution applied to a shape. In another embodiment, the rules used by an OPC engine are updated. In another embodiment, an OPC process is altered by modifying the number and/or location of dissection points of a mask feature. In yet another embodiment, an OPC process is altered by changing the location of EPE target points used by the OPC engine. In such embodiments, after the OPC process parameter is updated, an OPC process is run on the design database 100. Features 102 may also be optimized indirectly via an alternative correction and optimization process. In an embodiment, an alternative correction and optimization process is configured to modify attributes of features 102 such as size and dissection based on the results of the first lithography S&E.

A second lithography simulation and evaluation (lithography S&E) is performed in block 614. The second lithography S&E verifies the design database including the modification made in block 612 in response to the first lithography S&E. In an embodiment, the second lithography S&E is performed as part of making the modification. In one such embodiment, the results of the second lithography S&E is used to determine the modification being made in block 612. In a further embodiment, the second lithography S&E is performed concurrently with the modification in block 612. In yet a further embodiment, the second lithography S&E is performed after the design database is modified in block 612. In a further embodiment, the second lithography S&E is performed both concurrently with the modification and after the modification has been completed.

The second lithography S&E is performed against one or more lithographic performance indexes, which may incorporate determinations such as EPE, ILS, NILS, MEEF, PW, focus metrics including DoF, and any other relevant lithographic performance metric. The second lithography S&E does not necessarily perform the same lithography S&E against the same performance indexes as the first lithography S&E. Moreover, subsequent iterations of the second lithography S&E do not necessarily perform the same lithography S&E against the same performance indexes. In an embodiment, the performance indexes used by the second lithography S&E depend on the results of the first S&E. For example, the second lithography S&E may not check against performance indexes that were met during the first S&E. Eliminating redundant and unnecessary checks can greatly improve processing time and resources needed to perform the second lithography S&E. In a further embodiment, the performance indexes of the second lithography S&E depend on the modifications made to the design database as a result of the first lithography S&E. For example, a type of modification made to the design database 100 may require the second lithography S&E to check a specific performance index. Specifying performance indexes based on the type of modification provides an additional safeguard against introducing errors during the modification process. In yet a further embodiment, the performance indexes of the second lithography S&E depend on both the results of the first lithography S&E and on the modifications made to the design database as a result of the first lithography S&E. In another further embodiment, the performance indexes of the second lithography S&E depend on prior iterations of the second lithography S&E. For example, the performance indexes may vary based on the iteration number.

If the second lithography S&E determines that the design database does not meet the design criteria associated with the performance indexes, additional modifications to the design database 100 are made in block 612. These additional modifications may be based on the results of the second lithography S&E and/or the results of the first lithography S&E. Alternately, if the design database 100 meets the design criteria, the modified design database 100 is output in block 616. A mask is then manufactured based on the modified design database 100 in block 618. In an embodiment, the modified design database 100 is provided to a mask manufacturer for use in manufacturing a mask.

Figure 9:
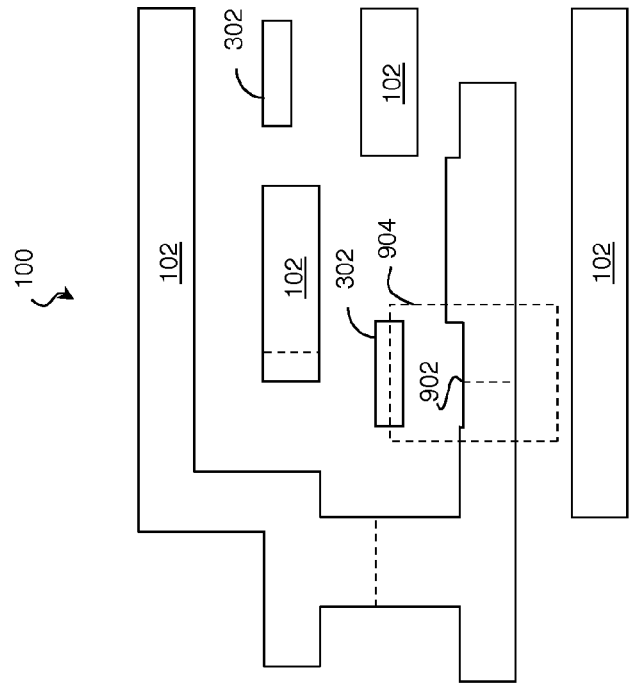
FIG. 9 is an illustration of features within an exemplary design database in various stages of a method of selective optical proximity correction and optimization performed according to various aspects of the present disclosure.
Figure 8:
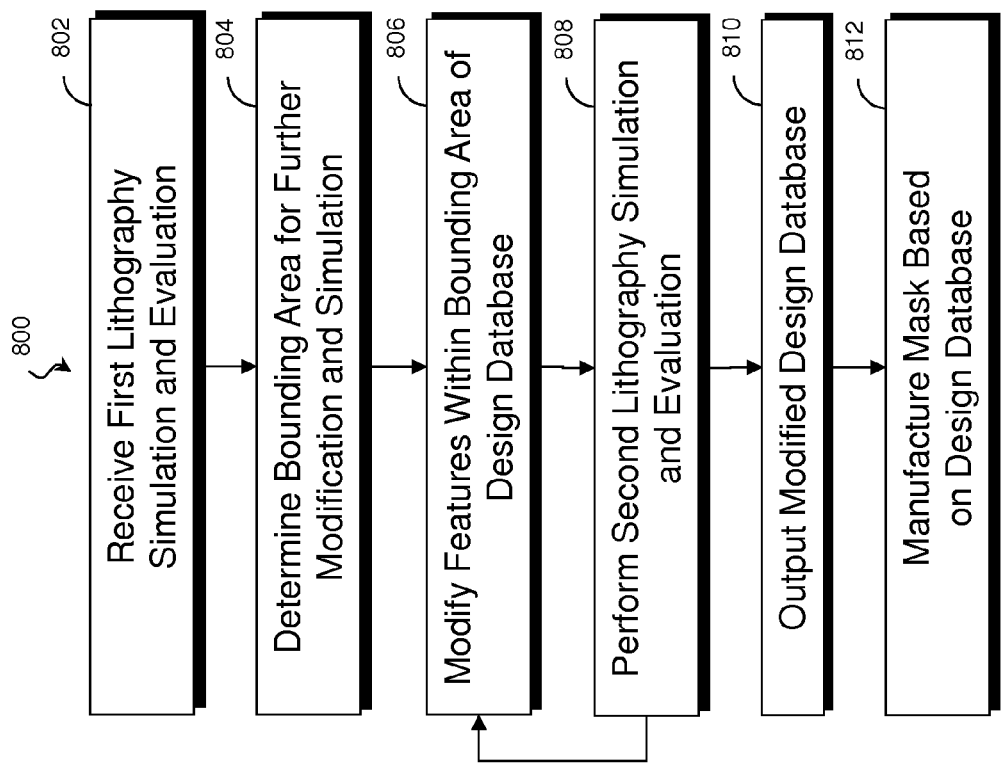
FIG. 8 is a flow diagram of a method of selective optical proximity correction and optimization according to various aspects of the present disclosure.

With reference to FIGS. 8 and 9, a method 800 of improving efficiency of optical proximity correction and optimization is described. FIG. 8 is a flow diagram of the method 800 of selective optical proximity correction and optimization according to various aspects of the present disclosure. FIG. 9 is an illustration of features 102 within an exemplary design database 100 in various stages of the method 800 according to various aspects of the present disclosure. It is understood that additional steps can be provided before, during, and after the method 800, and some of the steps described can be replaced or eliminated for other embodiments of the method.

In block 802, a first lithography simulation and evaluation is performed against one or more lithographic performance indexes. As described above, the performance indexes may incorporate determinations such as an EPE, ILS, NILS, MEEF, PW, focus metrics including DoF, and any other suitable lithographic performance metric. In block 804, bounding areas for further modification and simulation are determined. In an embodiment illustrated in FIG. 9, a bounding area 904 is determined based on the results of the first lithography S&E. During the first lithography S&E, an attribute of a mask feature as measured at location 902 is evaluated against a performance index. If the attribute does not meet the performance index, a bounding area 904 is determined for the corresponding error. The bounding area 904 is shaped such that further analysis and modification of database elements within the bounding area will suffice to resolve the violation. The dimensions of the bounding area 904 may be determined based on the results of the first lithography S&E. For example, a given performance index may correspond with a given bounding area size. The dimensions of the bounding area 904 may also be determined based on a property of the mask feature 102. For example, the bounding area 904 may be a factor of the size of the mask feature 102 that failed to meet a performance index. In an embodiment, the bounding area 904 is determined based on the results of the first lithography S&E and a property of a mask feature 102.

In block 806, features 102, SRAFs 302, and other database elements within the bounding area 904 are modified based on the results of the first lithography S&E. These modification may be made directly to the design database 100, may be made indirectly by modifying a parameter of an OPC process and then running the OPC process on the region defined by the bounding area, may be made by an alternative database correction process, and may be made by a combination of direct changes to the design database 100, by changes to an OPC process, and via an alternative database correction processes. Because modification and optimization can be limited to the elements within the bounding area 904, redundant and unnecessary analysis elsewhere can be eliminated. Moreover, the risk of introducing new violations outside the bounding area can be eliminated as well. Restricting changes to particular bounding areas promotes stability in the design database 100, especially in mature designs.

In block 808, a second lithography S&E is performed. In some embodiments, the second lithography S&E is only performed within the bounding area 904. In alternate embodiments, the second lithography S&E is only performed on areas determined by but not necessarily coextensive with the bounding areas 904. For example, the second lithography S&E may be performed on an area slightly larger than the bounding area 904. The second lithography S&E does not necessarily perform the same lithography S&E against the same performance indexes as the first lithography S&E. In an embodiment, the performance indexes of the second lithography simulation and evaluation depend on the results of the first lithography simulation and evaluation. In a further embodiment, the performance indexes of the second lithography S&E depend on the modifications made to the design database as a result of the first lithography S&E. In yet another embodiment, the performance indexes of the second lithography S&E depend on both the results of the first lithography S&E and on the modifications made to the design database as a result of the first lithography S&E.

If the second lithography S&E determines that the design database 100 does not meet the design criteria associated with the performance indexes, additional modifications to the design database 100 are made in block 806. These additional modifications may be based on the results of the second lithography S&E. If the design database 100 meets the design criteria, the modified design database 100 is output in block 810. A mask is then manufactured based on the modified design database 100 in block 812. In an embodiment, the modified design database 100 is provided to a mask manufacturer for manufacturing a mask corresponding to the design database 100.

Thus, the present invention provides a method for performing OPC and evaluating OPC solutions. In one embodiment, the method comprises: receiving a design database corresponding to a mask for IC circuit manufacturing, the design database containing a mask feature; performing a first lithography simulation and evaluation on the design database utilizing a first set of performance indexes; making a modification to the design database based on a result of performing the first lithography simulation and evaluation; performing a second lithography simulation and evaluation on the design database utilizing a second set of performance indexes to verify the modification; and providing the design database containing the modification to a mask manufacturer for manufacturing the mask utilizing the design database.

In a further embodiment, the method comprises: receiving a design database corresponding to a mask for IC circuit manufacturing, the design database containing a mask feature; making a first optical proximity correction (OPC) modification to the mask feature by performing a first OPC process, the first OPC process comprising: dividing the mask feature into a first plurality of child shapes at a first set of one or more fracture points; determining at least one edge placement error (EPE) factor for each of the first plurality of child shapes, the determining performed at a first set of locations; and adjusting an attribute of a child shape of the first plurality of child shapes based on the at least one EPE factor for the child shape; performing a first lithography simulation and evaluation of the mask feature utilizing a first set of performance indexes after making the first OPC modification; making a second OPC modification to the mask feature based on a result of performing the first lithography simulation and evaluation; and performing a second lithography simulation and evaluation of the mask feature utilizing a second set of performance indexes to verify the first and second OPC modifications.

In yet another embodiment, the method comprises: receiving a design database corresponding to a mask for IC circuit manufacturing, the design database containing a plurality of mask features; performing a first lithography simulation and evaluation of the design database utilizing a first set of performance indexes; determining a bounding area based on a result of performing the first lithography simulation and evaluation; making a modification to at least a first mask feature of the plurality of mask features based on the result of performing the first lithography simulation and evaluation, wherein the first mask feature is disposed within the bounding area; performing a second lithography simulation and evaluation of the design database utilizing a second set of performance indexes to verify the modification; and providing the design database containing the modification to a mask manufacturer for manufacturing the mask utilizing the design database.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a design database for manufacturing a lithographic integrated circuit (IC) mask;
using a computing system, performing a first optical proximity correction (OPC) process on the design database, wherein the first OPC process modifies a mask feature of the design database;
performing a first lithography simulation on the design database modified by the first OPC process;
based on a result of the first lithography simulation, performing a second OPC process on the design database modified by the first OPC process, wherein the second OPC process further modifies the mask feature of the design database, and wherein the second OPC process is performed on a region of the design database within a bounding area determined based on the result of the first lithography simulation; and
providing the design database modified by the second OPC process for manufacturing of the lithographic IC mask.

2. The method of claim 1, wherein a parameter of the second OPC process is determined based on the result of the first lithography simulation.

3. The method of claim 1, wherein an edge placement error (EPE) target point of the second OPC process is determined based on the result of the first lithography simulation.

4. The method of claim 1, wherein the first OPC process divides the mask feature into a first plurality of child shapes using a first set of dissection points, and wherein the second OPC process divides the mask feature into a second plurality of child shapes using a second set of dissection points that is different from the first set of dissection points and that is determined based on the result of the first lithography simulation.

5. The method of claim 1 further comprising: performing a second lithography simulation on the design database modified by the second OPC process.

6. The method of claim 5, wherein the second lithography simulation is performed on the region of the design database within the bounding area determined based on the result of the first lithography simulation.

7. The method of claim 5, wherein the first lithography simulation is performed using a first set of performance indexes; wherein the second lithography simulation is performed using a second set of performance indexes; and wherein the first set of performance indexes and the second set of performance indexes are different.

8. The method of claim 7, wherein the second set of performance indexes is determined based on the result of the first lithography simulation.

9. The method of claim 4, wherein the performing of the first lithography simulation determines an edge placement error (EPE) factor of a child shape of the first plurality of child shapes.

10. The method of claim 9, wherein locations of the second set of dissection points are based on the EPE factor.

11. The method of claim 5, wherein the second lithography simulation omits a check against an index that is met during the first lithography simulation.

12. A method comprising:
receiving a design database for a lithographic mask;
using a computer, performing a first optical proximity correction (OPC) process on the design database, wherein the first OPC process decomposes a mask feature into a first plurality of child shapes and modifies a boundary of at least one of the first plurality of child shapes;

performing a first lithography simulation on the design database having been modified by the first OPC process;

based on a result of the first lithography simulation, performing a second OPC process on the design database modified by the first OPC process, wherein the second OPC process decomposes the mask feature into a second plurality of child shapes and modifies a boundary of at least one of the second plurality of child shapes; and providing the design database having been modified by the second OPC process for manufacturing of the lithographic mask.

13. The method of claim 12, wherein the second OPC process is performed on a subset of the design database within a bounding area determined based on the result of the first lithography simulation.

14. The method of claim 12, wherein the performing of the first lithography simulation includes determining at least one edge placement error (EPE) factor for each of the first plurality of child shapes.

15. The method of claim 12, wherein shapes of the second plurality of child shapes are divided differently from shapes of the first plurality of child shapes.

16. The method of claim 12, performing a second lithography simulation on the design database after the second OPC process, wherein the second lithography simulation omits a check against an index that is met during the first lithography simulation.

17. A method comprising:

receiving a design database of an integrated circuit (IC) mask;

using a computer, performing a first optical proximity correction (OPC) process on the design database, wherein the first OPC process modifies the design database;

performing a first lithography simulation on the design database having been modified by the first OPC process;

based on a result of the first lithography simulation, identifying a subset of the design database having been modified by the first OPC process to undergo a second OPC process;

performing the second OPC process on the subset to further modify the design database; and providing the design database having been modified by the second OPC process for manufacturing of the IC mask.

18. The method of claim 17, wherein the first OPC process divides a feature of the design database into a first plurality of child shapes using a first set of dissection points, and wherein the second OPC process divides the feature into a second plurality of child shapes using a second set of dissection points that is different from the first set of dissection points and that is determined based on the result of the first lithography simulation.

19. The method of claim 18, wherein the performing of the first lithography simulation determines an edge placement error (EPE) factor of a child shape of the first plurality of child shapes.

20. The method of claim 19, wherein the second set of dissection points is based on the EPE factor.

* * * * *